(12) United States Patent
Narita

(10) Patent No.: US 8,340,119 B2
(45) Date of Patent: Dec. 25, 2012

(54) TRANSMISSION APPARATUS

(75) Inventor: Masahiro Narita, Gifu (JP)

(73) Assignee: Kyocera Corporation, Kyoto (JP)

( * ) Notice: Subject to any disclaimer, the term of this patent is extended or adjusted under 35 U.S.C. 154(b) by 184 days.

(21) Appl. No.: 12/679,662

(22) PCT Filed: Sep. 25, 2008

(86) PCT No.: PCT/JP2008/002662
§ 371 (c)(1),
(2), (4) Date: Jun. 7, 2010

(87) PCT Pub. No.: WO2009/041043
PCT Pub. Date: Apr. 2, 2009

(65) Prior Publication Data
US 2010/0260200 A1    Oct. 14, 2010

(30) Foreign Application Priority Data

Sep. 28, 2007   (JP) ................................ 2007-253398

(51) Int. Cl.
*H04L 12/43* (2006.01)
(52) U.S. Cl. .......................... 370/458; 375/297; 455/108
(58) Field of Classification Search .................. 370/252, 370/442, 458; 375/254, 296, 297, 300; 455/102, 455/108, 501
See application file for complete search history.

(56) References Cited

U.S. PATENT DOCUMENTS

| 6,141,533 | A | 10/2000 | Wilson et al. | |
|---|---|---|---|---|
| 2009/0023402 | A1* | 1/2009 | Shimizu et al. | 455/102 |
| 2010/0222015 | A1* | 9/2010 | Shimizu et al. | 455/102 |

FOREIGN PATENT DOCUMENTS

| JP | 2004-040553 | 2/2004 |
|---|---|---|
| JP | 2005-519513 | 6/2005 |
| JP | 2007-180782 | 7/2007 |
| JP | 2007-251427 | 9/2007 |
| WO | WO-03/075449 | 9/2003 |

OTHER PUBLICATIONS

Office Action from Korean Patent Application No. 10-2010-7007377, mailed on Apr. 14, 2011.
International Search Report for PCT/JP2008/002662, mailed on Dec. 9, 2008, 1 page.
International Preliminary Report on Patentability for PCT/JP2008/002662, issued May 4, 2010, 4 pages.
Notification of Reason(s) for Refusal (translation) for JP 2007-253398, mailed Feb. 14, 2012, 2 pages.

* cited by examiner

*Primary Examiner* — Ricky Ngo
*Assistant Examiner* — Kan Yuen
(74) *Attorney, Agent, or Firm* — Duane Morris LLP

(57) ABSTRACT

A modulator modulates the packet data signal. A correction unit 18 adjusts the amplitude component of the modulated data signal. An amplifier amplifies the adjusted data signal and outputs the data signal. A control unit controls the operation of the amplifier. The control unit turns on the operation of the amplifier at the header timing of a packet. The amplifier generates a transient response in the header part of the packet when the amplifier is turned on. In accordance with the inverse characteristic of the transient response generated in the amplifier, the correction unit adjusts the amplitude component of the modulated data signal.

3 Claims, 6 Drawing Sheets

TRANSMISSION APPARATUS

This is a U.S. National Phase Application of International Application No. PCT/JP2008/002662 filed Sep. 25, 2008, which claims priority to Japanese Patent Application No. 2007-253398 filed Sep. 28, 2007, the disclosures of which are incorporated herein by reference in their entirety.

TECHNICAL FIELD

The present invention relates to transmission techniques and particularly to a transmission apparatus that transmits amplified signals.

BACKGROUND ART

In recent years, wireless apparatuses have been developed such as mobile phones that use a scheme such as FDMA (Frequency Division Multiple Access), TDMA (Time Division Multiple Access) or CDMA (Code Division Multiple Access) for effective utilization of frequencies. Particularly in TDMA systems and TDD systems, transmission and reception are conducted on a time slot-by-time slot basis since multiplex or bidirectional communication is performed in a time-multiplexed manner. In the transmission side of such a system (hereinafter, referred to as a "transmission apparatus"), there is a possibility that the accuracy of the variations becomes worse as the output level of a transmission wave changes. For this reason, the output level of a transmission wave is preferably stable (for example, see patent document 1).

[Patent document No. 1] JP 2004-40553

DISCLOSURE OF THE INVENTION

[Problem to be Solved by the Invention]

In the case where transmission and reception are performed on time slot-by-time slot basis, a power amplifier, a LNA (Low Noise Amplifier), and the like are controlled, in order to save power, to be turned on only during transmission and reception (hereinafter, referred to as "communication interval"). In recent years, due to the employment of systems such as OFDM systems that require linearity, high linearity amplifiers are being required, and high-voltage operation devices such as LD-MOS or GaN devices are being used. Under such circumstances, when a power amplifier, etc., is turned on during the communication interval, a transient response is generated at the initial rise. Particularly, in the case of operations under high voltage, there is a possibility that the effects of the transient response become serious. When a signal passes through the power amplifier during when the transient response is being generated as described above, the signal waveform is deformed. As a result, the EVM (Error Vector Magnitude) becomes larger. Since such a transient response is not non-linear distortion, the transient response cannot be corrected by a linear compensation circuit.

In this background, a purpose of the present invention is to provide technology for reducing the effects of a transient response that is generated when an amplifier is turned from off to on.

[Means for Solving the Problem]

A transmission apparatus according to one embodiment of the present invention comprises: a modulator configured to modulate a packet data signal; an adjustment unit configured to adjust the amplitude component of the data signal modulated by the modulator; an amplifier configured to amplify the data signal adjusted by the adjustment unit and then output the data signal; and a control unit configured to control the operation of the amplifier. The control unit turns on the operation of the amplifier at the header timing of a packet, the amplifier generates a transient response in the header part of the packet when the amplifier is turned on by the control unit, and the adjustment unit adjusts, in accordance with the inverse characteristic of the transient response generated in the amplifier, the amplitude component of the data signal modulated by the modulator.

Another embodiment of the present invention also relates to a transmission apparatus. The transmission apparatus comprises: an input unit configured to input a packet data signal; a derivation unit configured to derive the envelope component of the data signal input by the input unit; an adjustment unit configured to adjust the amplitude component of the data signal input by the input unit; a modulator configured to modulate the data signal adjusted by the adjustment unit; a limiter configured to remove the envelope component from the data signal modulated by the modulator; an amplifier configured to amplify the data signal from which the envelope component is removed by the limiter so as to recreate the envelope component derived by the derivation unit; and a control unit configured to control the operation of the amplifier. The control unit turns on the operation of the amplifier at the header timing of a packet, the amplifier generates a transient response in the header part of the packet when the amplifier is turned on by the control unit, and the adjustment unit stores multiple types of inverse characteristics of the transient response generated in the amplifier in accordance with the value of the envelope component and adjusts the amplitude component of the data signal input by the input unit in accordance with an inverse characteristic selected based on the value of the envelope component derived by the derivation unit.

Optional combinations of the aforementioned constituting elements, and implementations of the invention in the form of methods, apparatuses, systems, recording mediums, and computer programs may also be practiced as additional modes of the present invention.

[Advantageous Effects]

According to the present invention, the effects of a transient response that is generated when an amplifier is turned from off to on can be reduced.

EXPLANATION OF REFERENCE

Figure 1:
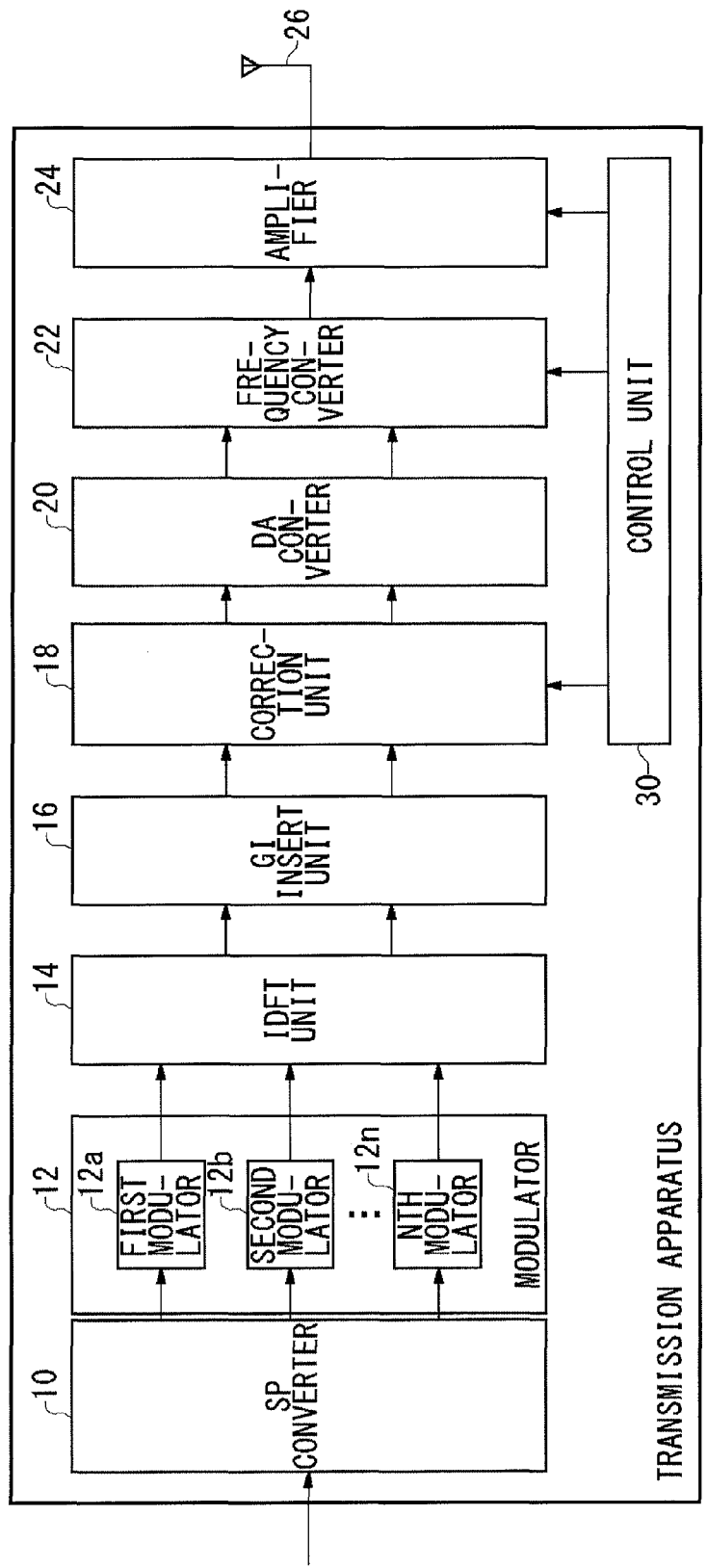
FIG. 1 is a diagram illustrating the configuration of a transmission apparatus according to an embodiment of the present invention.

10 SP converter
12 modulator

14 IDFT unit
16 GI insert unit
18 correction unit
20 DA converter
22 frequency converter
24 amplifier
26 antenna
30 control unit
32 memory unit
50 I/Q mapping unit
52 filter unit
54 correction unit
56 DA converter
58 modulator
60 limiter
62 amplifier
64 antenna
66 envelope calculation unit
68 DA converter
70 voltage control unit
72 switching unit
74 control unit
76 memory unit
100 transmission apparatus
110 transmission apparatus

BEST MODE FOR CARRYING OUT THE INVENTION

A brief description is now given before focusing on specific features of the present invention. Exemplary embodiments of the present invention relate to a communication system, just as a second generation cordless telephone system, that is adaptable to the TDMA scheme and the TDD scheme. Thus, frames in a communication system are formed by time division multiplexing of multiple time slots. Attention is now focused particularly on a transmission apparatus. The transmission apparatus is provided with a power amplifier, and the power amplifier is turned on at the header timing of the time slot in which a data signal is arranged (hereinafter, a data signal arranged in a time slot is also referred to as a "packet signal"). Therefore, a transient response is generated immediately after the amplifier is turned on, in other words, a transient response is generated at the header part of the time slot. As a result, the EVM becomes larger in the header part. In order to suppress the increase in the EVM, the transmission apparatus according to the present embodiment carries out the following process.

The transmission apparatus stores, in advance, the inverse characteristic of the transient response as a correction coefficient and multiplies, upon the detection of the header timing of a time slot, by the correction coefficient the data signal that corresponds to the header part. The multiplication of the amplitude characteristic of the correction coefficient and the amplitude characteristic of the transient response is 1. Thus, the effect of the transient response on a signal to be transmitted can be reduced. Recently, slot coupling and dynamic slot assignment are employed in order to increase the transmission speed. Slot coupling is a technique of transmitting a signal among time slots by coupling the successive time slots. The downlink/uplink ratio is changed freely in dynamic slot assignment, and dynamic slot assignment is used, for example, for WiMAX (registered trademark). The time for transient response varies in these situations. Therefore, in slot coupling, the transmission apparatus takes control so as not to correct the second time slot or later that have been coupled.

The transmission apparatus also takes control so that a period for correction can be changed.

FIG. 1 shows the configuration of a transmission apparatus 100 according to the embodiment of the present invention. The transmission apparatus 100 includes: a SP converter 10; a first modulator 12a, a second modulator 12b, and an Nth modulator 12n, which areal generically called a modulator 12; an IDFT unit 14; a GI insert unit 16; a correction unit 18; a DA converter 20; a frequency converter 22; an amplifier 24; an antenna 26; and a control unit 30.

The SP converter 10 inputs a packet signal and converts the format of the packet signal from a serial to parallel format. The transmission apparatus 100 is adaptable for an OFDM modulation scheme, and the SP converter 10 performs symbol mapping on a bit sequence of the input packet signal according to a subcarrier. The modulator 12 is provided so as to correspond to each subcarrier and modulates the packet signal. In other words, the modulator 12 performs complex modulation on the data signal input on a subcarrier-by-subcarrier basis so as to obtain in-phase and quadrature-phase components. The IDFT unit 14 performs an inverse discrete Fourier transform on the packet signal from the modulator 12. In other words, the IDFT unit 14 converts a signal from the frequency domain into the time domain. As a result, the orthogonality of a data signal for each subcarrier can be maintained. The GI insert unit 16 inserts a guard interval in the packet signal from the IDFT unit 14 for each symbol. The guard interval is also referred to as cyclic prefix.

The correction unit 18 adjusts the value of the amplitude component of the packet signal received from the GI insert unit 16. More specifically, in accordance with the inverse characteristics of the transient response in the amplifier 24, which will hereinafter be described in detail, the correction unit 18 corrects the amplitude component of the header part of the packet signal. A detailed description is now given regarding the correction. The amplifier 24 to be hereinafter described is turned on during the interval when a packet signal is generally transmitted, in other words, during the time slot period. Thus, a transient response is generated in the header part of the packet signal. A transient response is a phenomenon in which the amplification factor of the amplifier 24 is not constant when the power is turned on or off. In particular, the OFDM modulation scheme requires high linearity in amplification characteristic more than a single carrier scheme does; thus, an LD-MOS, a GaN, or the like is used as the amplifier 24. Thus, the power-supply voltage becomes as high as 28V or 48V, and the transient response becomes more undesirable.

Figure 2:
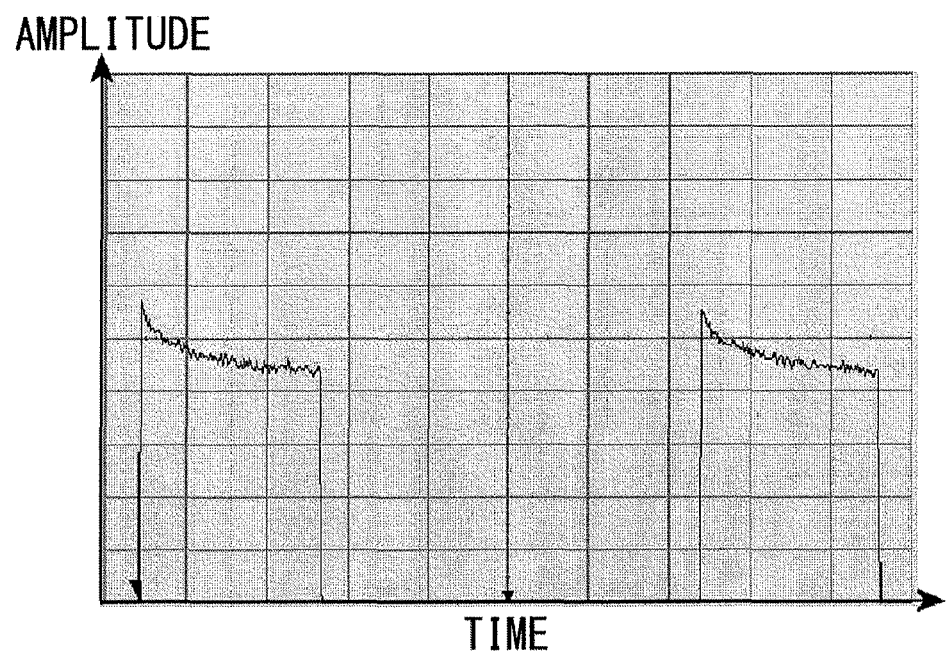
FIG. 2 is a diagram illustrating a transient response which is generated in subjects to be compared to the transmission apparatus shown in FIG. 1.

FIG. 2 illustrates a transient response which is generated in subjects to be compared to the transmission apparatus 100. FIG. 2 illustrates the output obtained when a sinusoidal wave is input into the amplifier 24. In FIG. 2, the horizontal axis represents time, and the vertical axis represents amplitude. A sinusoidal wave is arranged in two time slots that are separated in terms of time. As shown in the figure, in each of the time slots, the amplitude in the beginning is larger than the amplitude that follows, and the value of the amplitude decreases over time. The beginning corresponds to the above-described header part of the packet signal, and the phenomenon in which the value of the amplitude decreases over time corresponds to the transient response. Such a transient response has an affect on the EVM. FIG. 1 is referred back. In order to deal with such a phenomenon, the correction unit 18 stores the inverse characteristic of the transient response in advance as the correction coefficient.

Figure 3:
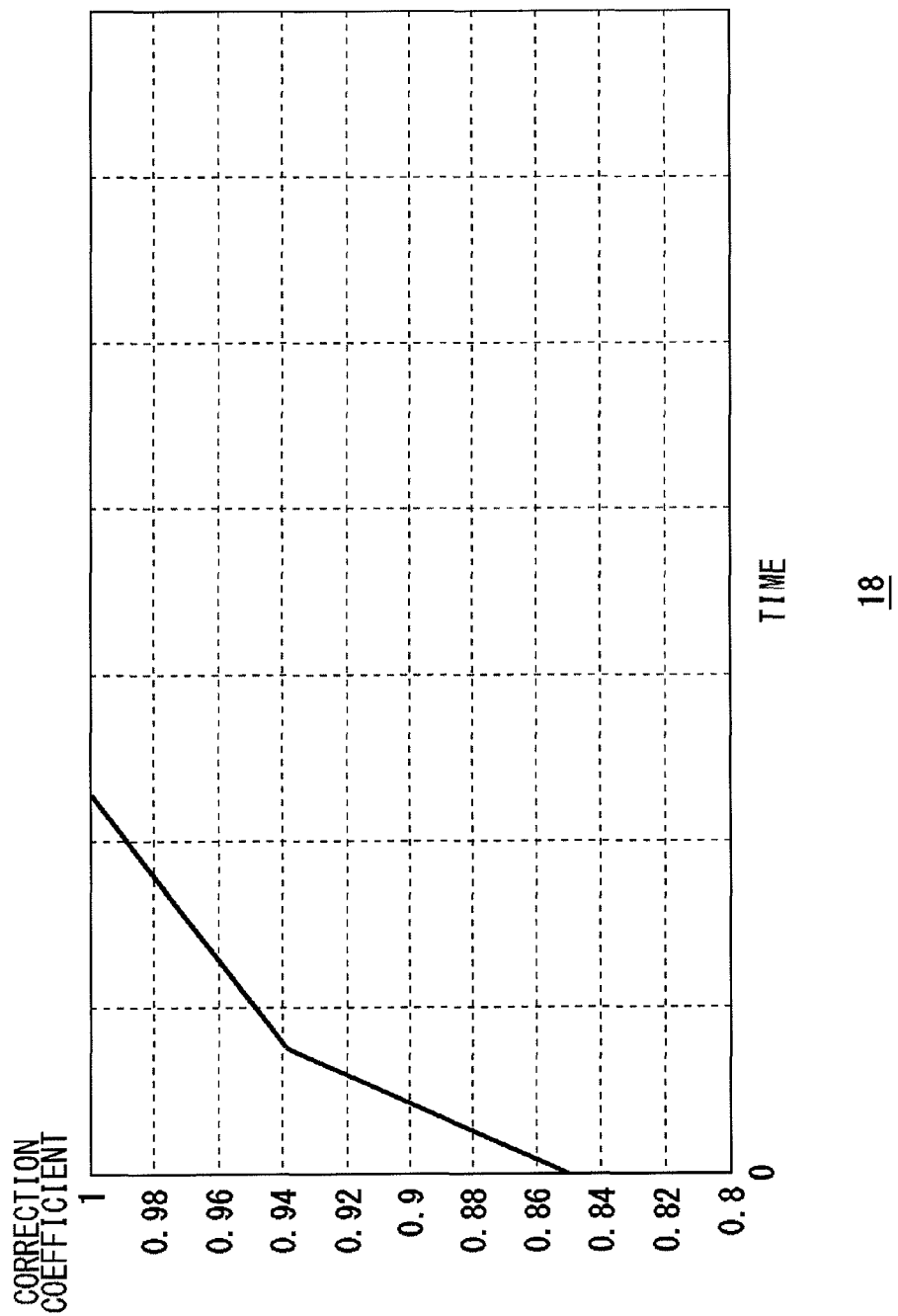
FIG. 3 is a diagram illustrating a correction coefficient stored in the correction unit shown in FIG. 1.

FIG. 3 is a diagram illustrating the correction coefficient stored in the correction unit 18. The horizontal axis represents time, and the vertical axis represents correction coefficient. The left side of the vertical axis corresponds to the header timing of a time slot. The correction coefficient is multiplied by the amplitude of the signal has been input to the correction unit 18. Upon the notification of the header timing of the time slot from the control unit 30, the correction unit 18 multiplies the packet signal by the leftmost correction coefficient in FIG. 3. The correction unit 18 extracts the correction coefficient by shifting from the left side to the right side over time and multiplies the packet signal by the extracted correction coefficient. In other words, the correction unit 18 uses a correction coefficient whose value increases over time, starting from the header timing of the time slot. By multiplying the packet signal by a correction coefficient such as that shown in FIG. 3 in a time-series order, the correction unit 18 generates an amplitude characteristic that is inverse of that of the transient response. As shown in the figure, the correction coefficient stays "1" after a certain timing. During that period, the correction unit 18 may discontinue the multiplication or multiply the packet signal by the value "1". FIG. 1 is now referred back.

The DA converter 20 converts the packet signal from the correction unit 18 from digital to analog. The frequency converter 22 quadrature-modulates the packet signal received from the DA converter 20 and frequency-converts the packet signal to be within the radio-frequency range. The amplifier 24 amplifies the packet signal from the frequency converter 22 and outputs the signal via the antenna 26. In other words, the amplifier 24 amplifies the packet signal to the transmission level. As described above, the amplifier 24 generates a transient response in the header part of the time slot, in other words, in the header part of the packet signal when the amplifier 24 is turned on by the control unit 30. However, since the packet signal is multiplied by the inverse characteristic of the transient response by the correction unit 18, the transient response of the amplifier 24 is reduced.

The control unit 30 determines multiple time slots and arranges a packet signal in the time slots. The control unit turns the operation of the amplifier 24 on at the header timing of the time slots, in other words, at the header timing of the packet signal when the packet signal is arranged in the time slots. In other words, the control unit 30 controls the operation of the amplifier 24 by applying the power-supply voltage to the amplifier 24. The control unit 30 notifies the correction unit 18 of the timing during which the amplifier 24 is turned on.

The control unit 30 may couple the time slots. As a result, the packet signal is arranged over the multiple time slots. In that case, the control unit 30 keeps the amplifier 24 being turned on over the entire period of the coupled time slots. The transient response during this time exhibits a characteristic where the characteristic similar to the output characteristic with regard to each packet signal in FIG. 2 further continues. In that case, the output characteristic of the amplifier 24 stays almost constant. The control unit 30 notifies the correction unit 18 of the information indicating that the time slots are coupled. The correction unit 18 discontinues the adjustment of the amplitude component at the header part of the subsequent time slot. In other words, the control unit 30 discontinues the multiplication using the correction coefficient or continues to multiply the packet signal by the value "1". This is same as performing a correction in accordance with slot coupling by changing the correction coefficient in accordance with slot coupling. Even when the downlink/uplink ratio is changed, the period for correction is changed in the same way, and the correction is performed by using an optimal correction coefficient.

Figure 4:
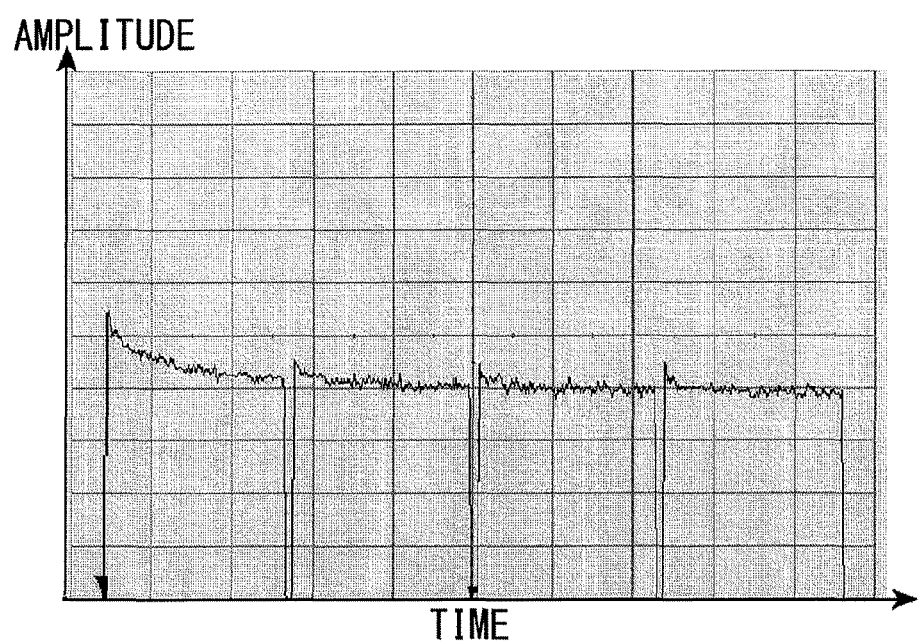
FIG. 4 is a diagram illustrating another transient response which is generated in subjects to be compared to the transmission apparatus shown in FIG. 1.

The control unit 30 can arrange the packet signal in successive time slots. This applies to the case where the packet signal is also arranged in the time slots between the two non-successive time slots in FIG. 2. In the figure, the packet signal is arranged in the two non-successive time slots. FIG. 4 illustrates another transient response which is generated in subjects to be compared to the transmission apparatus 100. As shown in the figure, the packet signal is arranged in each of the successive time slots. As obvious from the figure, the transient response in the case of the first time slot, in other words, the time slot with no preceding time slot in which a packet signal is arranged, and the transient response in the case of the time slot with a preceding time slot in which the packet signal is arranged are different from each other.

In order to deal with this, the control unit 30 stores, in advance, a correction coefficient that is different from the correction coefficient shown in FIG. 3. The different correction coefficient corresponds to the inverse characteristic of the transient response in the case of a time slot that is preceded by another time slot in which the packet signal is arranged. In other words, the value of the different correction coefficient of the header part of the time slot is larger than the value of the correction coefficient shown in FIG. 3. The correction unit 18 receives from the control unit 30 the timing for turning the amplifier 24 on. However, when the received timing is successive over multiple time slots, another inverse characteristic is used in the header part of the subsequent time slot.

The configuration is implemented in hardware by any CPU of a computer, memory, or other LSI's and in software by a program having a communication function or the like loaded into the memory. Functional blocks are implemented by the cooperation of hardware and software. Thus, a person skilled in the art should appreciate that there are many ways of accomplishing these functional blocks in various forms in accordance with the components of hardware only, software only, or the combination of both.

Figure 5:
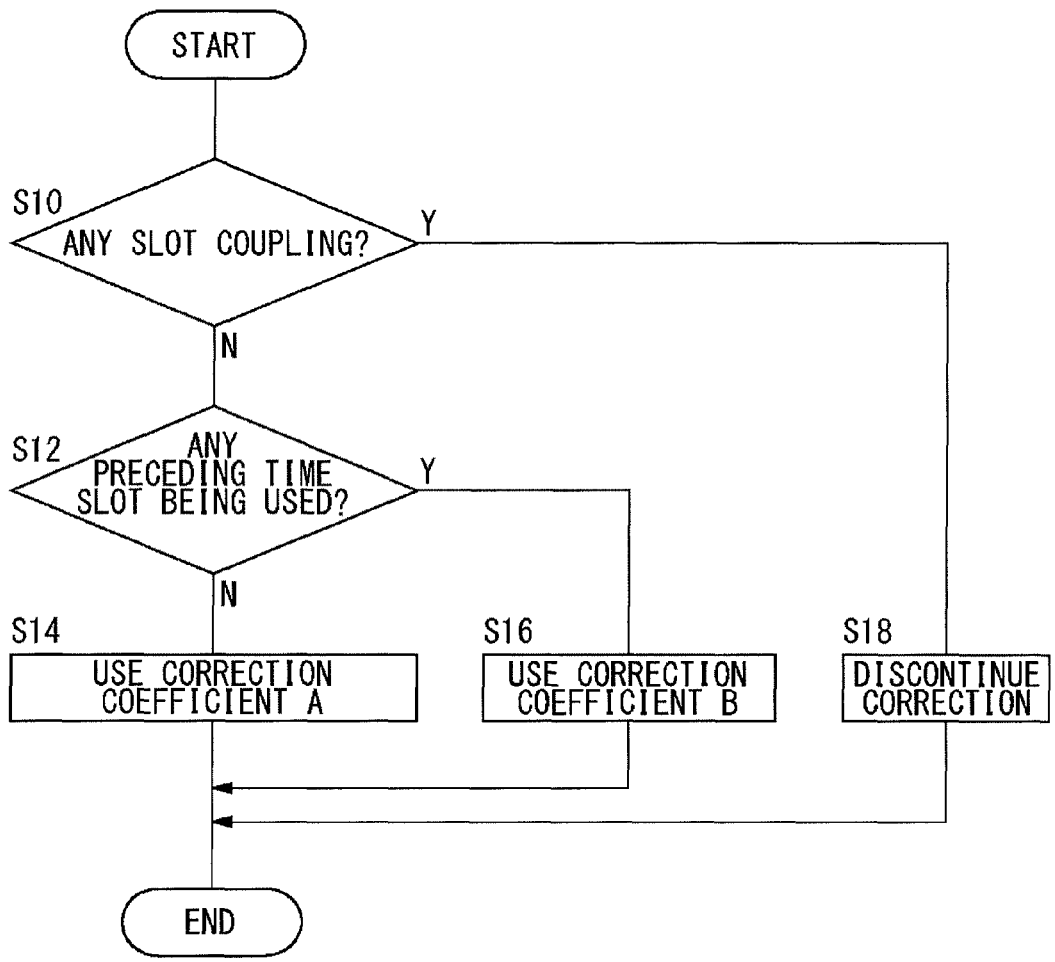
FIG. 5 is a flowchart illustrating a correction procedure in the transmission apparatus shown in FIG. 1.

An explanation is given of the operation of the transmission apparatus 100 having the above-stated configuration. FIG. 5 is a flowchart illustrating a correction procedure in the transmission apparatus 100. When there is no slot coupling (N in S10) and when no preceding time slot is used (N in S12), the correction unit 18 uses a correction coefficient A (S14). The correction coefficient A corresponds to the correction coefficient shown in FIG. 3. When a preceding time slot is used (Y in S12), the correction unit 18 uses a correction coefficient B (S16). The correction coefficient B is different from the correction coefficient shown in FIG. 3, and the correction coefficient B corresponds to the inverse characteristic of the transient response in the case of a time slot that is preceded by another time slot in which the packet signal is arranged. On the other hand, when there is slot coupling (Y in S10), the correction unit 18 discontinues the correction between time slots (S18).

An exemplary variation is described in the following. The exemplary variation explains EER (Envelope Elimination and Restoration) applications. EER is a publicly-known technique. Thus, the detailed explanation thereof is omitted. When the power efficiency is improved by increasing the linearity of the power amplifier, the bias voltage of the power amplifier is controlled by EER, and the characteristic of the transient response is thus changed. In order to deal with this, the correction coefficient is changed in accordance with the bias voltage in the exemplary variation. In the embodiment, the OFDM modulation scheme is used. However, in the exemplary variation, a single carrier scheme is used.

Figure 6:
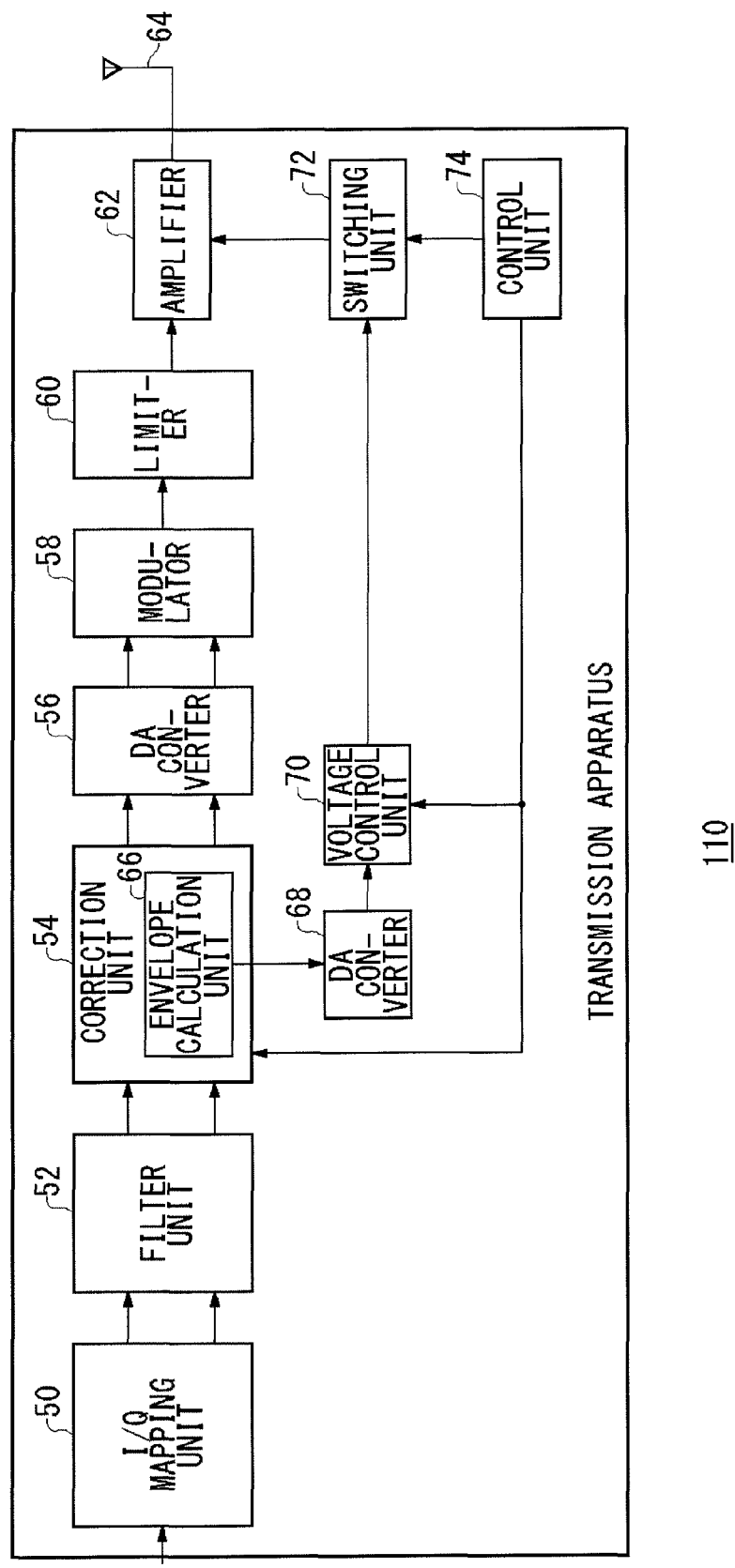
FIG. 6 is a diagram illustrating the configuration of a transmission apparatus according to the exemplary variation of the present invention.

FIG. 6 shows the configuration of a transmission apparatus 110 according to the embodiment of the present invention.

The transmission apparatus 110 includes an I/Q mapping unit 50, a filter unit 52, a correction unit 54, a DA converter 56, a modulator 58, a limiter 60, an amplifier 62, an antenna 64, a DA converter 68, a voltage control unit 70, a switching unit 72, and a control unit 74. The correction unit 54 includes an envelope calculation unit 66.

The I/Q mapping unit 50 inputs a packet signal. The I/Q mapping unit 50 converts the input packet signal into I/Q data (hereinafter, the packet signal converted into IQ data is also referred to as a "packet signal"). The filter unit 52 is a low-pass filter that band-limits the packet signal from the I/Q mapping unit 50. The signal, which is band-limited by the filter unit 52, is input into the modulator 58 to be hereinafter described. The signal modulated by the modulator 58 is shows as follows:

$$I^* \cos \omega_c t - Q^* \sin \omega_c t$$

The amplitude component and the phase component of the signal is shown as follows:

$$\Lambda = \sqrt{(I^2 + Q^2)}, \Phi = sgn(Q)\cos^{-1}(I/A)$$

where "sgn(Q)" is a function used to determine the sign of a number. Furthermore, the amplitude component of the signal modulated in the above-stated manner is removed by the subsequent limiter 60. The amplitude component can be also shown by envelope. The envelope can be recovered by controlling the bias voltage in the amplifier 62 to be hereinafter described.

The envelope calculation unit 66 inputs the packet signal from the filter unit 52 and derives the envelope component. This is same as deriving, in advance, the amplitude component to be eliminated by the subsequent limiter 60. More specifically, the envelope calculation unit 66 derives the envelope by calculating the above-mentioned A. The DA converter 68 converts the envelope derived by the envelope calculation unit 66 into an analog signal. The voltage control unit 70 controls the bias voltage of the amplifier 62 via the switching unit 72. In other words, the voltage control unit 70 controls the bias voltage of the amplifier 62 in accordance with the size of the analog signal from the DA converter so as to recover the amplitude component eliminated by the limiter 60. The switching unit 72 applies the bias voltage to the amplifier 62 over the interval of the time slots. The switching unit 72 receives notification indicating the interval of the time slots from the control unit 74. As a result, a transient response is generated in the amplifier 62 when the switching unit 72 is turned from off to on, that is, at the header timing of the time slots.

The correction unit 54 adjusts the amplitude component of the packet signal input from the filter unit 52. The correction unit 54, similar to the correction unit 18 in FIG. 1, stores, in advance, the inverse characteristic of the transient characteristic of the amplifier 62 as the correction coefficient and corrects the amplification component of the packet signal by the correction coefficient. Upon the receipt of the header timing of a time slot, the correction unit 54 starts the correction. The correction unit 54 stores multiple types of correction coefficients in accordance with the envelope component. The transient response generated in the amplifier 62 varies according to the value of the bias voltage, and the value of the bias voltage applied to the amplifier 62 varies according to the size of the envelope. Therefore, in order to correct different transient response, the correction unit 54 stores multiple types of correction coefficients.

The correction coefficient is expressed by a similar shape as that in FIG. 3. However, the value is different from that in FIG. 3. The correction unit 54 selects one correction coefficient based on the envelope derived by the envelope calculation unit 66. The correction unit 54 also corrects, while using the selected correction coefficient, the amplitude component of the packet signal in a similar manner as that shown in the embodiment. In other words, the switching unit 72 turns on the amplifier 62 only for the transmission interval, and a transient response is generated in the amplifier 62 immediately after it is turned on. In order to reduce the effects of the transient response, the correction unit 54 corrects the envelope. Since the transient response changes according to the bias voltage, the correction unit 54 selects a different correction coefficient based on the value of the envelope Λ.

The DA converter 56 digital-to-analog converts the packet signal from the correction unit 54. The modulator 58 modulates the packet signal from the DA converter 56. The limiter 60 removes the envelope component from the packet signal modulated by the modulator. The amplifier 62 amplifies the packet signal from which the envelope component is removed so as to recreate the envelope component derived by the envelope calculation unit 66. As described above, the amplifier 62 generates a transient response in the header part of the time slot when the amplifier 62 is turned on by the switching unit 72. The control unit 74 controls the operation of the correction unit 54 and the switching unit 72 and notifies the correction unit 54 and the switching unit 72 of the header timing of the time slot.

According to the embodiment of the present invention, the effects of a transient response can be reduced since the amplitude component is adjusted in accordance with the inverse characteristic of the transient response that is generated in an amplifier. Since a correction coefficient that changes over time is used, the effects of a transient response that is generated when an amplifier is turned from off to on can be reduced. Since a correction coefficient can be determined starting at the header timing of a time slot, the inverse characteristic of a transient response can be recreated. Since the correction of a subsequent time slot is discontinued when time slots are coupled, the correction can be properly performed on the time slot.

Since the correction coefficient is changed according to whether a packet signal is arranged or not arranged in successive time slots, the correction that is suitable for the actual transient response can be performed. Reducing the effects of a transient response allows for the increase in EVM to be suppressed. Suppressing the increase in EVM allows for the deterioration in communication quality to be suppressed. Preparing multiple types of correction coefficients in accordance with the value of the envelope allows for the effects of a transient response to be reduced even when the transient response varies due to the change in bias voltage. Correcting the transient response in consideration of the slot coupling and in consideration of the bias voltage allows for the increase in EVM to be suppressed.

Described above is an explanation based on the embodiments of the present invention. These embodiments are intended to be illustrative only, and it will be obvious to those skilled in the art that various modifications to constituting elements and processes could be developed and that such modifications are also within the scope of the present invention.

The OFDM modulation scheme is used in the embodiment, and the single carrier scheme is used in the exemplary variation. However, without limiting thereto, the above relationship may be reversed. The single carrier scheme may be used in the embodiment, and the OFDM modulation scheme may be used in the exemplary variation. According to the exemplary variation, the present invention can be applied to various communication schemes. Also, EER may be DPD.

[Industrial Applicability]

According to the present invention, the effects of a transient response that is generated when an amplifier is turned from off to on can be reduced.

The invention claimed is:

1. A transmission apparatus comprising:
   a modulator configured to modulate a packet data signal;
   an adjustment unit configured to adjust an amplitude component of the data signal modulated by the modulator;
   an amplifier configured to amplify the data signal adjusted by the adjustment unit and then output the data signal; and
   a control unit configured to control the operation of the amplifier, wherein
     when the control unit turns on the amplifier at a header timing of a packet, the amplifier generates a transient response, and
     the adjustment unit stores an inverse characteristic of the transient response in advance and thereafter adjusts, in accordance with the inverse characteristic of the transient response generated by the amplifier, the amplitude component of the data signal modulated by the modulator.

2. The transmission apparatus according to claim 1, wherein the control unit determines multiple time slots and arranges a packet data signal in the time slots, and the adjustment unit discontinues, when the packet data signal is arranged over the multiple time slots by the coupling of the time slots, the adjustment of the amplitude component at the header part of the subsequent time slot.

3. The transmission apparatus according to claim 1, wherein the control unit determines multiple time slots and arranges a packet data signal in the time slots, and the adjustment unit uses, when the packet data signal is allocated by the control unit to each of the successive time slots, another inverse characteristic in the header part of the subsequent time slot.

* * * * *